US006974720B2

(12) United States Patent
Sumakeris et al.

(10) Patent No.: US 6,974,720 B2
(45) Date of Patent: Dec. 13, 2005

(54) METHODS OF FORMING POWER SEMICONDUCTOR DEVICES USING BOULE-GROWN SILICON CARBIDE DRIFT LAYERS AND POWER SEMICONDUCTOR DEVICES FORMED THEREBY

(75) Inventors: Joseph John Sumakeris, Apex, NC (US); Hudson McDonald Hobgood, Pittsboro, NC (US); Michael James Paisley, Garner, NC (US); Jason Ronald Jenny, Raleigh, NC (US); Calvin H. Carter, Jr., Durham, NC (US); Valeri Fedorovich Tsvetkov, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/686,795

(22) Filed: Oct. 16, 2003

(65) Prior Publication Data

US 2005/0082542 A1   Apr. 21, 2005

(51) Int. Cl.$^7$ ...................... H01L 4/00; H01L 31/0312
(52) U.S. Cl. ........................................ 438/105; 257/77
(58) Field of Search .................... 257/77, 328–331; 438/105, 931

(56) References Cited

U.S. PATENT DOCUMENTS

| | | | |
|---|---|---|---|
| 4,260,448 A | 4/1981 | Herzer | |
| 4,766,482 A | 8/1988 | Smeltzer et al. | |
| 4,866,005 A | 9/1989 | Davis et al. | |
| 5,160,696 A | 11/1992 | Bowman | |
| 5,164,359 A | 11/1992 | Calviello et al. | |
| 5,296,258 A | 3/1994 | Tay et al. | |
| RE34,861 E | 2/1995 | Davis et al. | |
| 5,506,421 A | 4/1996 | Palmour | |
| 5,698,891 A | 12/1997 | Tomita et al. | |
| 5,704,985 A | 1/1998 | Kordina et al. | |
| 5,895,939 A | 4/1999 | Ueno | |
| 5,972,801 A | 10/1999 | Lipkin et al. | |
| 6,030,661 A | 2/2000 | Kordina et al. | |
| 6,039,812 A | 3/2000 | Ellison et al. | |
| 6,048,398 A | 4/2000 | Vehanen et al. | |
| 6,100,168 A | 8/2000 | Liao et al. | |
| 6,114,225 A | 9/2000 | Liao et al. | |
| 6,162,665 A | 12/2000 | Zommer | |
| 6,190,970 B1 | 2/2001 | Liao et al. | |
| 6,215,152 B1 | 4/2001 | Hebert | |
| 6,218,680 B1 | 4/2001 | Carter, Jr. et al. | |

(Continued)

FOREIGN PATENT DOCUMENTS

WO   WO 2004/020706 A1   3/2004

OTHER PUBLICATIONS

Baranov et al., "EPR Study of Shallow and Deep Phosphorous Centers in 6H-SiC," Physical Review B66, 2002, pp. 165206-1 through 165206-7.

(Continued)

*Primary Examiner*—Cuong Nguyen
(74) *Attorney, Agent, or Firm*—Myers Bigel Sibley & Sajovec, P.A.

(57) ABSTRACT

Methods of forming high voltage silicon carbide power devices utilize high purity silicon carbide drift layers that are derived from high purity silicon carbide wafer material, instead of prohibitively costly epitaxially grown silicon carbide layers. The methods include forming both minority carrier and majority carrier power devices that can support greater than 10 kV blocking voltages, using drift layers having thicknesses greater than about 100 um. The drift layers are formed as boule-grown silicon carbide drift layers having a net n-type dopant concentration therein that is less than about $2 \times 10^{15}$ cm$^{-3}$. These n-type dopant concentrations can be achieved using neutron transmutation doping (NTD) techniques.

13 Claims, 3 Drawing Sheets

U.S. PATENT DOCUMENTS

| | | | |
|---|---|---|---|
| 6,222,229 | B1 | 4/2001 | Hebert et al. |
| 6,359,309 | B1 | 3/2002 | Liao et al. |
| 6,391,690 | B2 | 5/2002 | Miyasaka |
| 6,396,080 | B2 | 5/2002 | Carter, Jr. et al. |
| 6,403,982 | B2 | 6/2002 | Carter, Jr. et al. |
| 6,472,677 | B1 | 10/2002 | Rodriguez et al. |
| 2001/0017374 | A1 | 8/2001 | Carter, Jr. et al. |
| 2003/0233975 | A1 | 12/2003 | Jenny et al. |

OTHER PUBLICATIONS

Rashid et al., "Trench Oxide Protection for 10 kV 4H-SiC Trench MOSFETs," Power Electronics and Drive Systems, 2003, vol. 2, pp. 1354-1358.

Sugawara et al., "12-19kV 4H-SiC pin Diodes with Low Power Loss," Proceedings of 2001 International Symposium on Power Semiconductor Devices & Ics. Osaka, pp. 27-30.

Notification of Transmittal of the International Search Report and the Written Opinion of the International Searching Authority, or the Declaration, PCT/US2004/031883, Jan. 7, 2005.

M.S. Schnöller, IEEE Transactions on Electron Devices, ED-21, May 1974, pp. 313-314.

Heissenstein et al., "Characterization of phosphorus doped $n$-type 6 $H$-silicon carbide epitaxial layers produced by nuclear transmutation doping," Journal of Applied Physics, vol. 83, No. 12, pp. 7542-7546, Jun. 15, 1998.

METHODS OF FORMING POWER SEMICONDUCTOR DEVICES USING BOULE-GROWN SILICON CARBIDE DRIFT LAYERS AND POWER SEMICONDUCTOR DEVICES FORMED THEREBY

FIELD OF THE INVENTION

The present invention relates to semiconductor device fabrication methods, and more particularly to methods of forming silicon carbide power devices and devices formed thereby.

BACKGROUND OF THE INVENTION

Semiconductor power devices are widely used to carry large currents and support high voltages. Conventional power devices are generally fabricated using silicon semiconductor material. One widely used power device is the power MOSFET. In a power MOSFET, a gate electrode provides turn-on and turn-off control upon the application of an appropriate gate bias. For example, turn-on in an n-type enhancement-mode MOSFET occurs when a conductive n-type inversion-layer channel (also referred to as "channel region") is formed in a p-type base region in response to application of a positive gate bias. The inversion-layer channel electrically connects the n-type source and drift/drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the gate electrode, minimal current demands are placed on the gate drive circuitry. Moreover, because current conduction in the MOSFET occurs through majority carrier transport using an inversion-layer channel, the delay associated with recombination and storage of excess minority carriers is not present. Accordingly, the switching speed of power MOSFETs can be made orders of magnitude faster than many minority carrier devices, such as bipolar transistors. Unlike bipolar transistors, power MOSFETs can be designed to withstand high current densities and the application of high voltages for relatively long durations, without encountering the destructive failure mechanism known as "second breakdown." Power MOSFETs can also be easily paralleled, because the forward voltage drop across power MOSFETs increases with increasing temperature, thereby promoting an even current distribution in parallel connected devices.

Efforts to develop power MOSFETs have also included investigation of silicon carbide (SiC) as a substrate material. Silicon carbide has a wider bandgap, a lower dielectric constant, a higher breakdown field strength, a higher thermal conductivity and a higher saturation electron drift velocity compared to silicon. Accordingly, silicon carbide power devices may be made to operate at higher temperatures, higher power and voltage levels and/or with lower specific on-resistance relative to silicon power devices. Nonetheless, the voltage rating of silicon carbide power devices may still be limited if the voltage supporting drift regions therein are insufficiently thick. Thus, notwithstanding the preferred electrical characteristics of silicon carbide, there continues to be a need for silicon carbide power devices having thicker voltage supporting regions therein.

SUMMARY OF THE INVENTION

Methods of forming high voltage silicon carbide power devices utilize silicon carbide drift layers that are derived from high purity silicon carbide wafer material, instead of costly epitaxially grown silicon carbide layers. The methods include forming minority and/or majority carrier power devices that can support greater than 10 kV blocking voltages and may use drift layers having thicknesses greater than about 100 um. These majority and minority carrier power devices include MOSFETs, JFETs, PiN diodes, IGBTs, BJTs, GTOs and other devices. In particular, the use of high purity silicon carbide wafer material in minority carrier devices may result in devices having a characteristic minority carrier lifetime in excess of 50 nanoseconds. Methods of forming silicon carbide power devices according to some embodiments of the present invention include forming silicon carbide power MOSFETs that support 10 kV or higher blocking voltages. This can be done by forming a 4H boule-grown silicon carbide drift layer having a net n-type dopant concentration therein that is less than about $2 \times 10^{15}$ cm$^{-3}$ and forming a p-type silicon carbide base region on the silicon carbide drift layer. Techniques to form boule-grown silicon carbide include sublimation growth, continuous growth and high temperature CVD. The p-type silicon carbide base region may form a p-n rectifying junction with the drift layer. An n-type silicon carbide source region is also formed, which defines a p-n rectifying junction with the p-type silicon carbide base region. A gate electrode is formed adjacent the p-type silicon carbide base region. The gate electrode is sufficiently proximate the base region so that application of a gate electrode voltage of sufficient magnitude results in the formation of an inversion-layer channel in the base region. This inversion-layer channel operates to provide an electrically conductive path between the source region and the drift layer during forward on-state conduction.

According to some embodiments of the present invention, the step of forming a silicon carbide drift layer is preceded by the steps of forming a silicon carbide boule using a seeded sublimation growth technique and then irradiating the silicon carbide boule with thermal neutrons of sufficient fluence to thereby transmute silicon atoms to n-type phosphorus atoms within the silicon carbide boule. In particular, the irradiating step may be performed under conditions that yield a compensated n-type dopant concentration that is less than about $2 \times 10^{15}$ cm$^{-3}$ within the boule. The irradiating step is then followed by the step of sawing the silicon carbide boule to yield many 4H sublimation-grown silicon carbide wafers. Next, the wafer is aggressively annealed at a sufficiently high temperature and for a sufficient duration to remove irradiation damage. The annealing step may also operate to activate the n-type phosphorus atoms (e.g., those that are not on lattice sites) and reduce a density of traps in the wafer to a sufficient level to yield high purity drift layer material, which may have a characteristic minority carrier lifetime of greater than about 50 nanoseconds. Following the annealing step, the wafer may be planarized to a desired thickness, which may be a function of the voltage rating of the desired power device.

Methods of forming silicon carbide power devices according to additional embodiments of the present invention include forming a silicon carbide diode by aggressively annealing and then planarizing a 4H sublimation-grown silicon carbide wafer having a net n-type dopant concentration therein, to yield an n-type drift layer having opposing C and Si faces thereon and a thickness in a range from between about 100 μm and about 400 μm. An N+ silicon carbide layer may then be epitaxially grown or implanted on the C-face of the n-type drift layer and a p+ silicon carbide layer may be epitaxially grown or implanted on the Si-face of the n-type drift layer. The p+ silicon carbide layer, the n-type drift layer and the n+ silicon carbide layer may collectively form a P-i-N diode having a blocking voltage greater than about 10 kV. Here, the p+ silicon carbide layer may operate to inject minority carriers (e.g., holes) of sufficient quantity into the drift layer to cause conductivity modulation therein when the diode is forward biased.

According to still further embodiments of the present invention, a silicon carbide junction field effect transistor (JFET) may be formed by forming a 4H boule-grown silicon carbide drift layer having a net n-type dopant concentration therein in a range from between about $2 \times 10^{14}$ cm$^{-3}$ and about $2 \times 10^{15}$ cm$^{-3}$ and then forming an n-type silicon carbide epilayer on a Si-face of the silicon carbide drift layer. This n-type epilayer operates as the channel region of the JFET. An n-type silicon carbide source region is formed on or within the n-type silicon carbide epilayer. The n-type source region is more highly doped than the n-type epilayer and the n-type epilayer is more highly doped than the n-type drift layer. A p-type silicon carbide gate electrode is formed on the n-type silicon carbide epilayer so that a p-n rectifying junction is defined therebetween. When reversed biased, this p-n rectifying junction operates to deplete the n-type epilayer of majority carriers and block a forward on-state conduction path between the n-type source region and the n-type drift layer. This forward on-state conduction path may extend through an opening in a p-type silicon carbide buried region, which extends between the n-type epilayer and the n-type drift layer. In particular, a p-type silicon carbide buried region may be formed adjacent a Si-face of the drift layer prior to forming the n-type epilayer.

DESCRIPTION OF PREFERRED EMBODIMENTS

Figure 1:
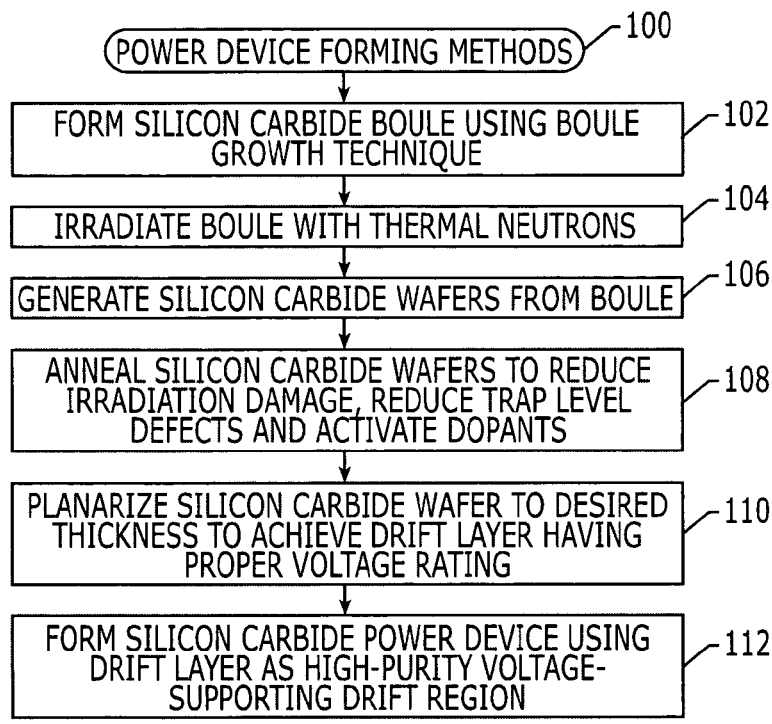
FIG. 1 is a flow-diagram that illustrates methods of forming silicon carbide power devices according to embodiments of the present invention.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or p-type, however, each embodiment described and illustrated herein includes its complementary embodiment as well. The phrase "net n-type dopant concentration" refers to the concentration of activated n-type dopants after compensation effects are taken into account. Like numbers refer to like elements throughout. Unless otherwise noted, references to silicon carbide materials include 4H, 6H, 15R and 3C silicon carbide materials.

Referring now to FIG. 1, methods 100 of forming silicon carbide power devices according to first embodiments of the present invention include forming a silicon carbide (SiC) boule using a boule growth technique, Block 102. This silicon carbide boule may be formed as a high-purity semi-insulating (HPSI) silicon carbide boule using a seeded sublimation growth technique. Exemplary sublimation growth techniques are more fully described in U.S. Patent Publication No. 2001/0017374 and in U.S. Pat. Nos. 6,403,982, 6,218,680, 6,396,080, 4,866,005 and Re. 34,861, the disclosures of which are hereby incorporated herein by reference. Sublimation techniques may also include gas fed sublimation, continuous growth and high-temperature CVD.

The SiC boule is then irradiated with thermal neutrons to provide a desired level of phosphorus doping, Block 104. These phosphorus dopants may be partially compensated by a naturally occurring background concentration of p-type dopants (e.g., boron) within the boule material. During the irradiation step, some fraction of the silicon atoms ($^{30}$Si) within the silicon carbide boule will capture thermal neutrons and undergo the following reaction: [$^{30}$Si(n,γ)$^{31}$Si]. The subsequent beta particle decay (β$^-$) results in the formation of phosphorus atoms $^{31}$P, which operate as n-type dopants (i.e., donors) within silicon carbide. The density of the phosphorus atoms is primarily controlled by the level of the thermal neutron fluence (neutrons/cm$^2$). To achieve a net n-type dopant concentration in a range from between about $2 \times 10^{14}$ cm$^{-3}$ and about $2 \times 10^{15}$ cm$^{-3}$, a neutron fluence in a range from between about $1 \times 10^{17}$ cm$^{-2}$ and about $1 \times 10^{20}$ cm$^{-2}$ may be used. This neutron irradiation step is commonly referred to as neutron transmutation doping (NTD). Neutron transmutation doping (NTD) may also be used to provide compensating dopants to a semiconductor substrate (e.g., boule, wafer) having net p-type conductivity. Accordingly, NTD may be used to support the generation of net p-type drift layers having a desired p-type dopant concentration level by tailoring the net doping through partial compensation of excess p-type dopants.

Figure 2:
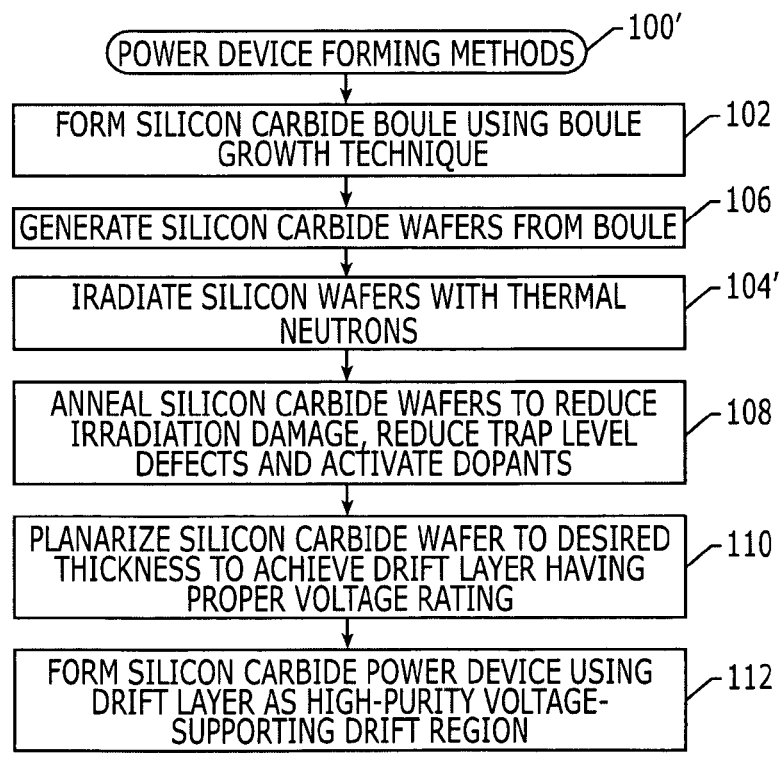
FIG. 2 is a flow-diagram that illustrates additional methods of forming silicon carbide power devices according to embodiments of the present invention.

As illustrated by Block 106, conventional sawing operations may be performed to generate a plurality of silicon carbide wafers from the silicon carbide boule. These wafers, which may have a thickness in a range from between about 100 um and about 1000 um, are preferably formed as 4H silicon carbide wafers. Alternatively, the sequence of the steps illustrated by Blocks 104 and 106 may be reversed. In particular, FIG. 2 illustrates related methods 100' whereby respective wafers are irradiated using neutron transmutation doping (NTD) techniques, Block 104'. This sequence of steps allows for the establishment of different donor dopant levels within different groups of wafers taken from the same silicon carbide boule.

Referring now to Block 108 in FIGS. 1 and 2, an aggressive annealing step is performed to reduce irradiation damage and the density of trap level defects within the wafers. The annealing step may, in some embodiments, operate to activate the phosphorus dopants. The aggressive annealing step may be performed at a temperature in a range from between about 1300° C. and about 2200° C., for a duration in a range from between about 10 minutes and about 500 minutes.

Once annealed, the wafers may be planarized to a desired thickness that accords with a voltage rating of the power devices to be formed, Block 110. This planarization step may be performed by chemically-mechanically polishing (CMP) both faces of the wafers. As described herein, the desired thickness may be in a range from between about 100 um, for a power device rated up to about 20 kV, and about 400 um, for a power device rated up to about 80 kV. Once planarized, the silicon carbide wafers may be used as n-type voltage supporting drift layers. These drift layers have thicknesses that are substantially greater than can be commercially achieved using more costly epitaxially growth techniques. In particular, the drift layers may be used as substrates from which a variety of silicon carbide power devices may be formed, Block 112. Then, upon completion of back-end processing steps to form various power devices, including MOSFETs, JFETs, P-i-N diodes, IGBTs, BJTs and GTOs, the drift layers may be diced into discrete power devices having one or more unit cells therein. These discrete devices may then be packaged using conventional packaging techniques.

Figure 3:
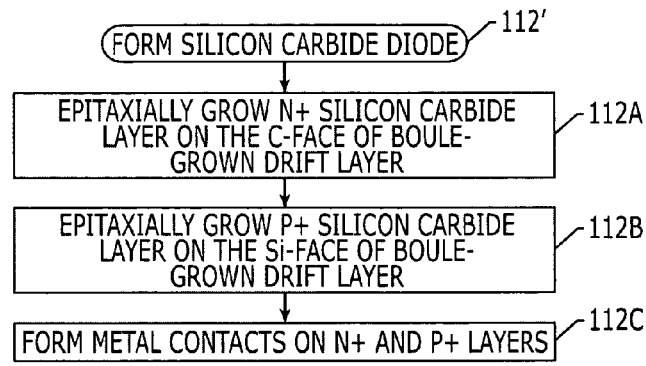
FIG. 3 is a flow-diagram that illustrates methods of forming silicon carbide P-i-N diodes according to embodiments of the present invention.
Figure 6:
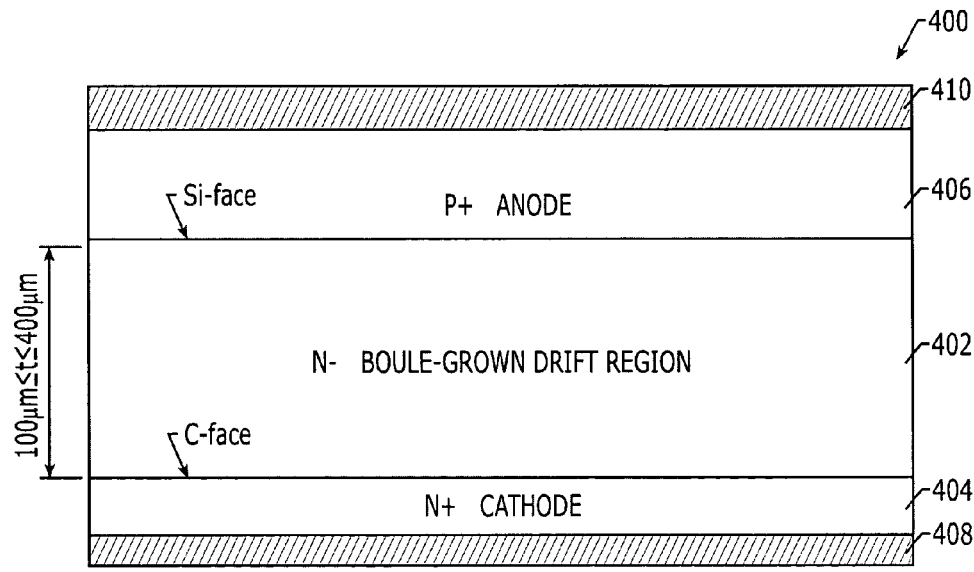
FIG. 6 is a cross-sectional view of a silicon carbide P-i-N diode according to embodiments of the present invention.

An exemplary sequence of back-end processing steps 112' that results in the formation of a P-i-N diode 400 is illustrated by FIGS. 3 and 6. As illustrated by Block 112A, the polished C-face of a boule-grown drift layer 402 may be used as a substrate to epitaxially grow an n+ silicon carbide epilayer of predetermined thickness, which operates as a cathode region 404 of the P-i-N diode 400. Similarly, the polished Si-face of the boule-grown drift layer 402 may be used as a substrate to epitaxially grow a p+ silicon carbide epilayer of predetermined thickness, which operates as an anode region 406 of the P-i-N diode 400, Block 112B. In alternative embodiments, these n+ and p+ epilayers may be formed by implanting n-type and p-type dopants into the drift layer 402. Top-side and bottom-side metal contacts may also be formed as anode and cathode electrodes 410 and 408, respectively, using conventional metallization techniques, Block 112C.

Figure 4:
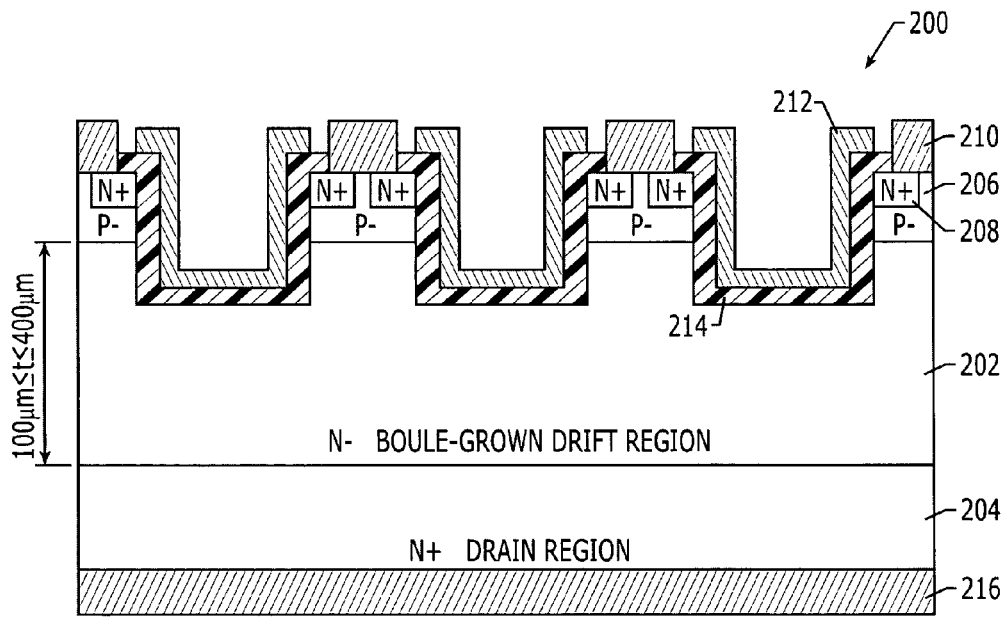
FIG. 4 is a cross-sectional view of a silicon carbide power MOSFET according to embodiments of the present invention.

Methods of forming power MOSFETs according to embodiments of the present invention will now be described more fully with reference to FIG. 4. In FIG. 4, a vertical power MOSFET 200 is illustrated having an n-type 4H boule-grown silicon carbide drift region 202 therein. The drift region 202 may have a net n-type dopant concentration therein that is less than about $2\times10^{15}$ cm$^{-3}$. The thickness "t" of the drift region 202 may be in a range from between about 100 μm, for up to a 20 kV MOSFET, and about 400 um, for up to an 80 kV MOSFET. An n+ drain region 204 is also provided on a C-face of the drift region 202. The n+ drain region 204 may be formed using conventional epitaxial growth techniques. A p-type base region 206 (shown as p−) may also be epitaxially grown on a Si-face of the drift region 202. A masked implantation step may then be performed to define a plurality of highly doped n+ source regions 208 within the p-type base region 206. Next, a selective etching step may be performed to define a plurality of trenches that extend through the base region 206 and into the drift region 202. The sidewalls and bottoms of the trenches are then lined with a gate insulating layer 214 that also extends along a top surface of the p-type base region 206. The gate insulating layer 214 may comprise silicon dioxide or other suitable dielectric material. Openings may then be defined within the gate insulating layer 214, which reveal the source regions 208 and base region 206.

Conventional metallization techniques may be performed to define (i) a source electrode 210, which ohmically contacts the n+ source regions 208 and the p-type base region 206, (ii) a trench-based gate electrode 212, which extends on the gate insulating layer 214, and (iii) a drain electrode 216. Based on this vertical configuration of the gate electrode 212, the application of sufficiently positive gate bias to the gate electrode 212 will result in the formation of vertical inversion-layer channels that operate to electrically connect the n+ source regions 208 to the n-type drift region 202. These vertical inversion-layer channels extend across the p-type base region 206, along the sidewalls of the trenches. During forward on-state conduction, when the drain region 204 is more positively biased relative to the source regions 208, the inversion-layer channels operate to pass majority carriers (i.e., electrons) from the source regions 208 to the drift region 202.

Figure 5:
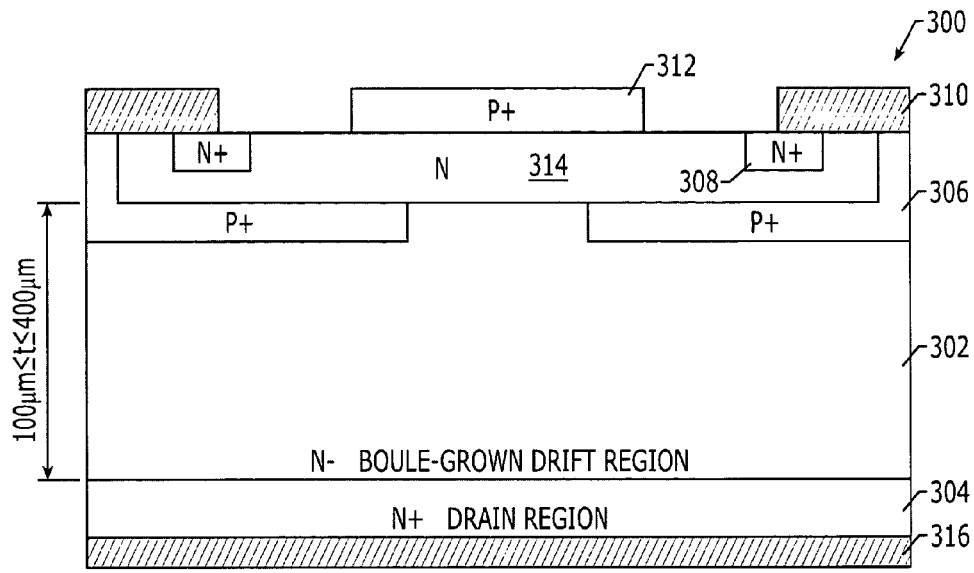
FIG. 5 is a cross-sectional view of a silicon carbide JFET according to embodiments of the present invention.

Methods of forming power JFETs according to embodiments of the present invention will now be described more fully with reference to FIG. 5. In FIG. 5, a junction field effect transistor 300 is illustrated having an n-type 4H boule-grown silicon carbide drift region 302 therein. The drift region 302 may have a net n-type dopant concentration therein that is less than about $2\times10^{15}$ cm$^{-3}$. The thickness "t" of the drift region 302 may be in a range from between about 100 um, for up to a 20 kV JFET, and about 400 um, for up to an 80 kV JFET. An n+ drain region 304 is provided on a C-face of the drift region 302. The n+ drain region 304 may be formed using conventional epitaxial growth techniques. A p-type buried region 306 (shown as p+) may be formed in the Si-face of the drift region 302. The buried region 306, which is illustrated as having an opening therein, may be formed by implanting p-type dopants into the Si-face of the drift region 302, through openings defined within an implant mask. In alternative embodiments, a p-type buried region may be formed on the C-face and an n-type drain region may be formed on the Si-face, however, this is typically less preferred.

A relatively thin n-type silicon carbide channel region 314 may then be formed on the buried region 306, as illustrated. The channel region 314, which may have a thickness of about 0.5 um, may be formed as an epitaxial layer, using the exposed portion of the buried region 306 and the drift region 302 as a seed during epitaxial growth. During the epitaxial growth step, the channel region 314 may be in-situ doped to a level of about $1\times10^{17}$ cm$^{-3}$. Conventional techniques may then be performed to define an n+ silicon carbide source region 308 within the n-type silicon carbide channel region 314. The source region 308 may be defined as a plurality of parallel stripe-shaped regions that extend in a third dimension (not shown) or as a ring-shaped region, for example. p-type dopants may also be selectively implanted into the channel region 314 in order to extend the buried region 306 to an upper surface of the channel region 314. A p-type silicon carbide gate electrode 312 may be formed on the channel region 314, at a location extending opposite the opening in the p-type buried region 306. In this manner, the establishment of a sufficient large reverse bias between the p-type gate electrode 312 and the n-type channel region 314 will operate to fully deplete the channel region 314 of majority charge carriers and thereby block forward on-state conduction between the source region 308 and the drift region 302. Conventional metallization techniques may then be performed to define a source electrode 310, which ohmically contacts the n+ source regions 308 and the p-type buried region 306, and a drain electrode 316 which ohmically contacts the n+ drain region 304.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a silicon carbide MOSFET device having a 10 kV or higher blocking voltage rating, comprising the steps of:
   forming a silicon carbide boule using a seeded sublimation growth technique or a high-temperature CVD growth technique;
   irradiating the silicon carbide boule with thermal neutrons of sufficient fluence to thereby transmute some fraction of silicon atoms to phosphorus atoms within the silicon carbide boule;
   forming a silicon carbide wafer from the irradiated silicon carbide boule;
   forming a boule-grown silicon carbide drift layer having a net n-type dopant concentration therein that is less than about $2 \times 10^{15}$ cm$^{-3}$ by annealing the silicon carbide wafer at a sufficient temperature to reduce a trap density therein;
   forming a p-type silicon carbide base region on the silicon carbide drift layer;
   forming an n-type silicon carbide source region that defines a p-n rectifying junction with the p-type silicon carbide base region; and
   forming a gate electrode on the p-type silicon carbide base region.

2. The method of claim 1, wherein the silicon carbide drift layer has a thickness in a range from between about 100 μm and about 400 μm.

3. A method of forming a high-voltage silicon carbide device, comprising the steps of:
   forming a silicon carbide boule using a seeded sublimation growth technique or a high-temperature CVD growth technique;
   irradiating the silicon carbide boule with thermal neutrons of sufficient fluence to thereby transmute some fraction of silicon atoms to phosphorus atoms within the silicon carbide boule;
   forming a silicon carbide wafer from the irradiated silicon carbide boule;
   forming a boule-grown silicon carbide drift layer having a net n-type dopant concentration therein that is less than about $2 \times 10^{15}$ cm$^{-3}$ by annealing the silicon carbide wafer at a sufficient temperature to achieve a characteristic minority carrier lifetime in excess of 50 nanoseconds therein; and
   forming n-type and p-type silicon carbide layers on the silicon carbide drift layer.

4. The method of claim 3, wherein the silicon carbide drift layer has a thickness in a range from between about 100 μm and about 400 μm.

5. A method of forming a silicon carbide JFET having a 10 kV or higher blocking voltage rating, comprising the steps of:
   forming a boule-grown silicon carbide drift layer having a net n-type dopant concentration therein that is less than about $2 \times 10^{15}$ cm$^{-3}$;
   forming an n-type silicon carbide epilayer on the silicon carbide drift layer;
   forming an n-type silicon carbide source region in the n-type silicon carbide epilayer; and
   forming a p-type silicon carbide gate electrode on the n-type silicon carbide epilayer;
   wherein said step of forming an n-type silicon carbide epilayer is preceded by the step of forming a p-type silicon carbide buried region in the silicon carbide drift layer;
   wherein said step of forming an n-type silicon carbide epilayer comprises forming an n-type silicon carbide epilayer that defines a p-n rectifying junction with the p-type silicon carbide buried region and a non-rectifying junction with the silicon carbide drift layer; and
   wherein said step of forming a p-type silicon carbide gate electrode comprises forming a p-type silicon carbide gate electrode that extends opposite a portion of the p-type silicon carbide buried region.

6. The method of claim 5, further comprising the step of forming a source electrode that ohmically contacts the n-type silicon carbide source region and the p-type silicon carbide buried region.

7. The method of claim 5, wherein said step of forming a boule-grown silicon carbide drift layer comprises annealing a boule-grown silicon carbide wafer at a sufficiently high temperature to reduce a density of traps therein.

8. A method of forming a silicon carbide JFET having a 10 kV or higher blocking voltage rating, comprising the steps of:
   forming a silicon carbide boule using a seeded sublimation growth technique;
   irradiating the silicon carbide boule with thermal neutrons of sufficient fluence to thereby transmute silicon atoms to phosphorus atoms within the silicon carbide boule;
   forming a silicon carbide drift layer having a net n-type dopant concentration therein that is less than about $2 \times 10^{15}$ cm$^{-3}$ from the irradiated silicon carbide boule;
   forming an n-type silicon carbide epilayer on the silicon carbide drift layer;
   forming an n-type silicon carbide source region in the n-type silicon carbide epilayer; and
   forming a p-type silicon carbide gate electrode on the n-type silicon carbide epilayer.

9. The method of claim 8, wherein the silicon carbide drift layer has a thickness in a range from between about 100 μm and about 400 μm.

10. A method of forming a silicon carbide MOSFET device having a 10 kV or higher blocking voltage rating, comprising the steps of:
   forming a silicon carbide boule using a seeded sublimation growth technique;
   irradiating the silicon carbide boule with thermal neutrons of sufficient fluence to thereby transmute some fraction of silicon atoms to phosphorus atoms within the silicon carbide boule;
   forming a silicon carbide drift layer having a net first conductivity type dopant concentration therein that is less than about $2 \times 10^{15}$ cm$^{-3}$ from the irradiated silicon carbide boule;

forming a second conductivity type silicon carbide base region on the silicon carbide drift layer;

forming a first conductivity type silicon carbide source region that defines a p-n rectifying junction with the second conductivity type silicon carbide base region; and forming a gate electrode on the second conductivity type silicon carbide base region.

11. The method of claim 10, wherein the silicon carbide drift layer has a thickness in a range from between about 100 μm and about 400 μm.

12. A method of forming a high-voltage silicon carbide device, comprising the steps of:

forming a silicon carbide boule using a seeded sublimation growth technique or a high-temperature CVD growth technique;

irradiating the silicon carbide boule with thermal neutrons of sufficient fluence to thereby transmute some fraction of silicon atoms to phosphorus atoms within the silicon carbide boule;

forming a silicon carbide wafer from the irradiated silicon carbide boule; and forming a boule-grown silicon carbide drift layer having a net n-type dopant concentration therein that is less than about $2 \times 10^{15}$ cm$^{-3}$ by annealing the silicon carbide wafer at a sufficient temperature to achieve a characteristic minority carrier lifetime in excess of 50 nanoseconds therein.

13. The method of claim 12, wherein the silicon carbide wafer layer has a thickness in a range from between about 100 μm and about 400 μm.

* * * * *